United States Patent [19]

Hirao et al.

[11] 4,366,569

[45] Dec. 28, 1982

[54] SEMICONDUCTOR LASER DEVICE INCLUDING AN ARRANGEMENT FOR PREVENTING LASER DEGRADATION CAUSED BY EXCESSIVE CURRENT FLOW

[75] Inventors: Motohisa Hirao, Tokyo; Michiharu Nakamura, Hinodemachi; Atsutoshi Doi, Ohme; Shinji Tsuji, Kokubunji; Yutaka Takeda, Ohme; Takao Mori, Hachioji, all of Japan

[73] Assignee: Hitachi, Ltd., Tokyo, Japan

[21] Appl. No.: 191,293

[22] Filed: Sep. 26, 1980

[30] Foreign Application Priority Data

Sep. 28, 1979 [JP] Japan ................................. 54-124118

[51] Int. Cl.³ ............................................. H01S 3/19
[52] U.S. Cl. ........................................ 372/46; 357/17
[58] Field of Search .............. 331/94.5 H; 357/17–18; 372/46

[56] References Cited

PUBLICATIONS

Burnham et al., "Distributed Feedback Buried Heterostructure Diode Laser", *Applied Physics Letters*, vol. 29, No. 5, Sep. 1, 1976, pp. 287–289.
Nelson et al., "High–Output Power–InGaAsP (2=1.3 μm) Strip–Buried Heterostructure Lasers", *Appl. Phys. Lett.* 35(5), Mar. 1, 1980, pp. 358–360.
Hirao et al., "Fabrication and Characterization of Narrow Stripe InGaAsP/InP Buried Heterostructure Lasers", *J. Appl. Phys.* 51(8), Aug. 1980, pp. 4539–4540.

*Primary Examiner*—James W. Davie
*Attorney, Agent, or Firm*—Antonelli, Terry and Wands

[57] ABSTRACT

Disclosed herein is a semiconductor laser device including at least an active region consisting of a semiconductor material and a semiconductor region consisting of a material having a different composition from that of the active region and confining the active region, wherein at least one p-n junction is formed inside the confining region in parallel to the active region and a current flowing through the active region at a field strength below an electric field causing degradation of the semiconductor laser device is allowed to flow through regions other than the active region via the p-n junction by controlling the impurity concentration of the region having the p-n junction. The semiconductor laser device does not undergo catastrophic degradation even when applied with a current higher than a rated value.

5 Claims, 8 Drawing Figures

SEMICONDUCTOR LASER DEVICE INCLUDING AN ARRANGEMENT FOR PREVENTING LASER DEGRADATION CAUSED BY EXCESSIVE CURRENT FLOW

BACKGROUND OF THE INVENTION

This invention relates to a semiconductor laser device.

DESCRIPTION OF THE PRIOR ART

Semiconductor laser devices having a so-called "double hetero structure" are now known widely but these devices involve the following drawback. Since these semiconductor laser devices are of the type which operate while concentrating a current on an extremely minute active region, catastrophic degradation of the devices readily occurs if a current exceeding a rated current is caused to erroneously flow or a noise current such as a surge current is applied. A laser typical of these devices is disclosed in U.S. Pat. No. 4,121,177.

To cope with this drawback, it has been a customary practice to provide an external protective circuit.

SUMMARY OF THE INVENTION

The present invention provides a semiconductor laser device which does not undergo catastrophic degradation even when applied with a current exceeding a rated value.

In a semiconductor laser device including at least an active region consisting of a semiconductor material and a semiconductor region having a different composition from that of the active region and confining the active region, the present invention provides a semiconductor laser device in which at least one p-n junction is formed in the confining region in parallel to the active region, and a current flowing through the active region at a field strength below an electric field causing degradation of the semiconductor laser device is allowed to flow through regions other than the active region via the p-n junction by controlling the impurity concentration in the region having the p-n junction.

DETAILED DESCRIPTION OF THE PREFERRED EMBODIMENTS

Figure 1:
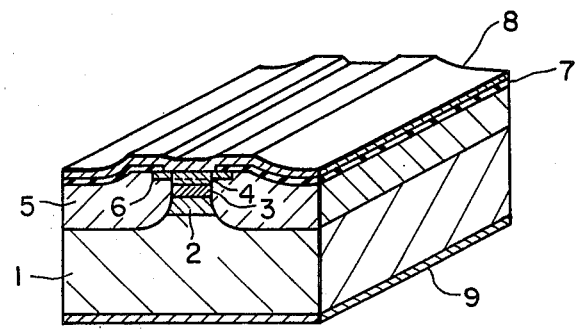
FIG. 1 is a perspective view of the conventional buried hetero structure type semiconductor laser device.

An example of a prior art semiconductor laser device having a buried hetero structure is illustrated in FIG. 1. A GaAs-GaAlAs type semiconductor laser device by way of example has the following construction.

Namely, layers of n-type $Ga_{0.7}Al_{0.3}As$ 2, p-type GaAs 3 and p-type $Ga_{0.7}Al_{0.3}As$ 4 are sequentially allowed to grow epitaxially in the liquid phase on an n-type GaAs substrate 1. The p-type GaAs 3 sometimes contains trace amounts of Al and is converted to a $Ga_{0.95}Al_{0.05}As$ layer in order to facilitate the liquid phase epitaxial growth. Next, the layer is mesa-etched in a depth reaching the substrate and is then subjected to the liquid phase epitaxial growth of the second stage. In this epitaxial growth, n-type $Ga_{0.7}Al_{0.3}As$ is formed so as to encompass the p-type GaAs 3 as the active region which is perfectly buried in $Ga_{0.7}Al_{0.3}As$. After the epitaxial growth is completed, shallow Zn diffusion is applied to the surface via an oxidized film 7. Reference numerals 8 and 9 represent ohmic electrodes for the p-type and n-type layers, respectively.

In the present invention, a p-n junction is disposed inside crystals other than the active region of the semiconductor laser device and the impurity concentration of this p-n junction is controlled to a predetermined value so as to by-pass an excessive current into the regions other than the active region and to prevent degradation of the device. In the case of the buried hereto structure type laser, the buried layer 5 can be used as a region in which the p-n junction is disposed.

Figure 2:
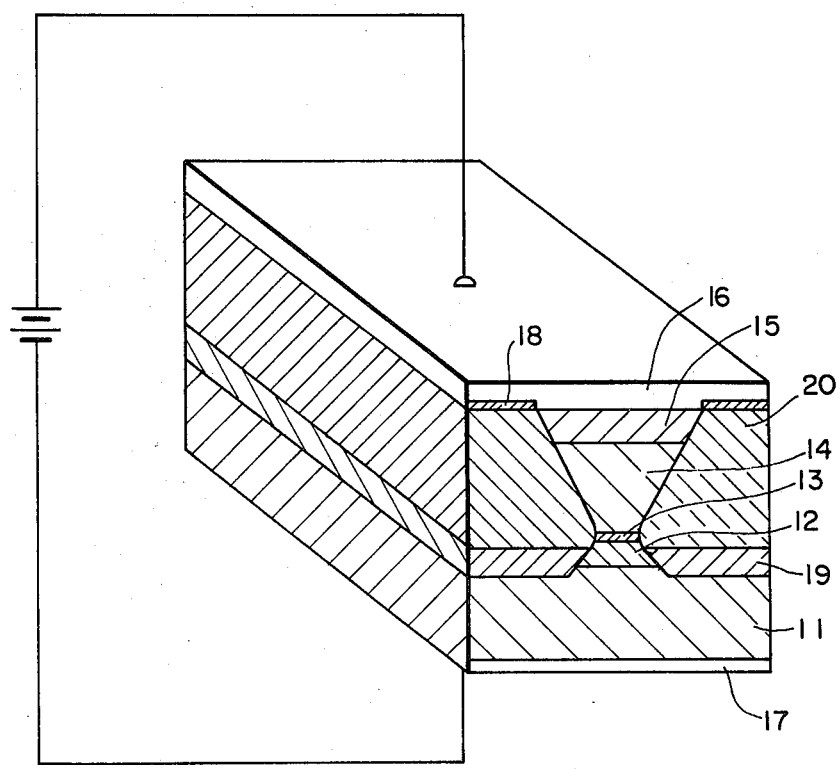
FIGS. 2 and 8 are perspective views of the semiconductor laser device in accordance with the present invention.

FIG. 2 is a perspective view of the semiconductor laser device in accordance with the present invention. Hereinafter, the present invention will be described in detail with reference to a InP-InGaAsP system buried hetero structure type semiconductor laser device by way of example. Needless to say, the present invention can also be applied to various other semiconductor laser devices such as the aforementioned GaAs-GaAlAs type, GaSb-GaAlAsSb type, GaAsP-InGaAsP type, PbSnTe type, CdTe type, HgTe type, and so forth.

In the embodiment shown in FIG. 2, reference numeral 11 represents an n-type InP substrate; 12 is an n-type InP clad layer; 13 is an InGaAsP active region; 14 is a p-type InP clad layer; 15 is an InGaAsP cap layer; and 16 and 17 are ohmic electrodes for the p-type and n-type layers, respectively. The active region and the clad layers interposing the active region between them are selected in the same way as in the semiconductor laser device having the ordinary double-hetero structure. Namely, the active region $In_{1-x}Ga_xAs_yP_{1-y}$ ($0<x<1$, $0<y<1$) is generally selected in the following manner for the InP substrate.

Namely, though the band gap can take the value of from 0.75 to 1.35 eV, InP matches with the lattice constant with x and y that satisfy the following band gap:

$$E(x,y) = 1.35 + 0.668x - 1.7y + 0.758x^2 + 0.18y^2 - 0.069xy - 0.322x^2y + 0.03xy^2 (eV)$$

Incidentally, the active region and a confining layer consisting of the clad layers interposing the active region between them are buried on their side surfaces by means of buried layers 19, 20, the side surfaces being parallel to the travelling direction of the laser light. Conventionally, the buried layers of this type are disposed in order to concentrate a current on the active region of the laser. For this reason, it has been believed preferable that the impurity concentration of n-type InP layer 20 and p-type InP layer 19 be low. The impurity concentration of the clad layers and the confining layer has been at least $1 \times 10^{18}$ to $2 \times 10^{18} cm^{-3}$ (a concentration of up to about $5 \times 10^{18} cm^{-3}$ has been practically used) and the un-doped active layer generally has an impurity concentration of at least $1 \times 10^{18} cm^{-3}$, while the impurity concentration of the buried layers has been in the order of $10^{16} cm^{-3}$.

The present invention sets the impurity concentration of the aforementioned p-n junction to at least $10^{17} cm^{-3}$. Depending upon the kind of semiconductor materials and requirements for setting of a break-over voltage, the concentration of the confining region including the active region, that of the clad layers, and that of the buried layer are selected. Generally, the p-n junction formed by the p-type layer 19 and the n-type layer 20 is brought under the reverse-biased state during the operation of the laser and operates as a blocking layer for the current. When the operating current of the laser is increased, however, the voltage applied to the p-n junction exceeds the reverse voltage and causes break-down. Due to this break-down, the buried layers on both sides of the active layer become conductive and capable of by-passing the current through them. Even if a voltage exceeding this break-over voltage $V_{BO}$ is applied to the semiconductor laser device, the current flowing through the active layer of the laser device does not increase and hence, the laser device does not undergo degradation.

In the case of injection type semiconductor laser devices, the present invention can be established, regardless of the constituent materials.

In the present invention, at least one p-n junction is formed in parallel to the active region and a by-pass is formed, whenever necessary. Accordingly, the semiconductor layers and the like to be juxtaposed with the active region are not restricted to those shown in the embodiment. As the semiconductor layers to be juxtaposed with the active region, a plurality of semiconductor layers may be laminated.

EXAMPLE 1

Figure 3:
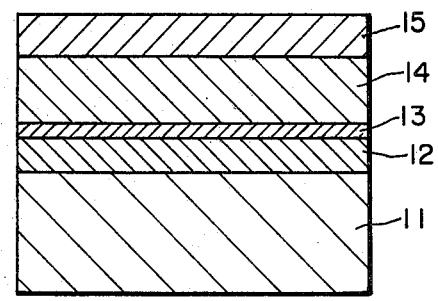
FIGS. 3 through 5 are sectional views showing stepwise the production steps of the semiconductor laser device in accordance with the present invention.
Figure 4:
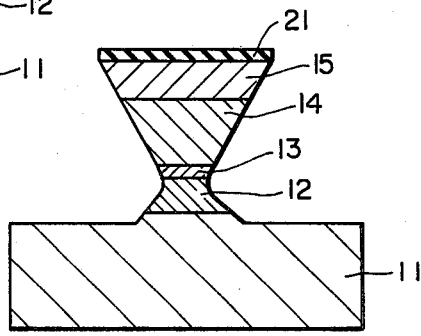
Figure 5:
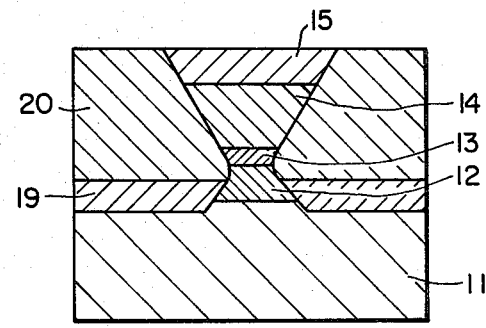

FIGS. 3 through 5 are sectional views showing step-wise the production steps of the semiconductor laser device.

Onto the (100) plane of an n-type InP substrate 11, the following layers are sequentially formed by the liquid phase epitaxial growth in each thickness stipulated (see FIG. 3);

n-type InP layer 12 as a buffer layer (Te-doped, impurity concentration $3 \times 10^{18} cm^{-3}$, 2–3 μm thick);

$In_{0.73}Ga_{0.27}As_{0.63}P_{0.37}$ layer 13 (un-doped, impurity concentration $5 \times 10^{16} cm^{-3}$, 0.3 μm thick);

p-type InP layer 14 (Zn-doped, impurity concentration $2 \times 10^{18} cm^{-3}$, 3.0 μm thick), and $In_{0.83}Ga_{0.17}As_{0.37}P_{0.63}$ layer 15 (Zn-doped, impurity concentration $2 \sim 3 \times 10^{18} cm^{-3}$, 0.5 μm).

Here, the semiconductor layer 13 functions as the active layer and the semiconductor layers 12 and 13 function as the clad layers, the layer 15 function as the cap layer. Incidentally, the liquid phase epitaxial growth may be practised by a method using a known sliding boat. Needless to say, the gaseous phase epitaxial growth may also be employed.

Next, a 6 μm-wide $SiO_2$ film 21 is formed in the <110> direction parallel to the cleavage direction of the crystal.

The $SiO_2$ film may be formed by an ordinary CVD process using known monosilane added with oxygen.

Using this $SiO_2$ film as the mask, the abovementioned multilayered epitaxial growth film is etched using a mixed solution of bromo-methanol (1% bromine). This step forms a belt-like confining region on the semiconductor substrate 11 (see FIG. 4). After this etching step, the epitaxial growth of the subsequent semi-conductor layers is made. First, p-type InP 19 (Zn-doped, impurity concentration $1 \times 10^{18} cm^{-3}$) is formed in a thickness of 1 μm and n-type InP 20 (Te-doped, impurity concentration $2 \times 10^{18} cm^{-3}$) is formed in a thickness of 4 μm by the epitaxial growth, respectively, said thickness corresponding to the etching depth, respectively. Since the growth occurs only in the region where etching reaches the n-type InP substrate 11, there is obtained a structure of which section is shown in FIG. 5. As a result, a pnpn structure is formed in a structure passing the clad layer 14, the growth layers 19, 20 and the n-type InP substrate.

After this growth is effected, the surface oxidized film is removed and an Au-Sn eutectic composition is evaporated on the n-type substrate InP crystal side thereby to form an n-electrode while Cr-Au is evaporated on the p-type crystal surface thereby to form a p-electrode.

Finally, the semiconductor assembly for forming an optical cavity is vertically cleft in the aforementioned belt-like region, thereby completing the semiconductor laser device. FIG. 2 is a perspective view of this device. Incidentally, the laser cavity length is 300 μm.

Figure 6:
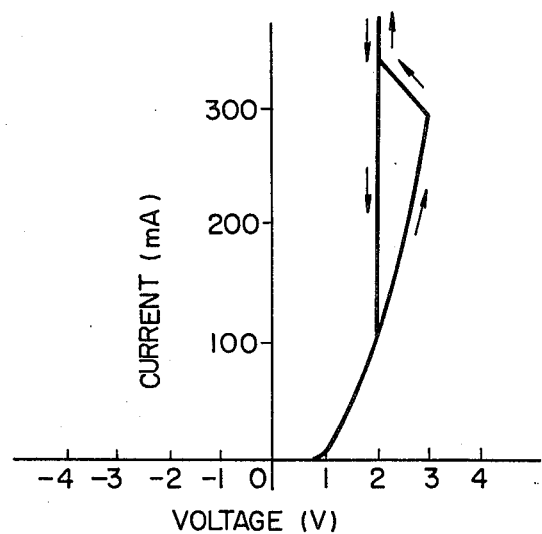
FIG. 6 is a diagram showing the current-vs-voltage characteristic of the semiconductor laser device in accordance with the present invention.

FIG. 6 shows current-vs-voltage characteristic of the abovementioned element in the DC operation. The circuit via the side surfaces of the buried layers has the pnpn junction consisting of the p-type InP layer 14, the n-type InP layer 20, the p-type InP layer 19 and the n-type InP layer 11. The current-vs-voltage characteristic has the negative resistance region. The break-over voltage $V_{BO}$ is 3 V and the current at this time is 300 mA. The light output of this laser device in the DC operation is 30 mW and is below the catastrophic degradation limit. When a further excessive current is applied, the laser device does undergo degradation.

Setting of the break-over voltage varies with the structure of the semiconductor device because the voltage of the catastrophic degradation limit varies with the laser structure. Hence, design may be made in accordance with the laser structure. It is imperative that the impurity concentration of the n-type and p-type layers, that together form the p-n junction which is placed in the reverse-biased state under the operation of the laser device, be at least $5 \times 10^{17} cm^{-3}$, respectively.

Figure 7:
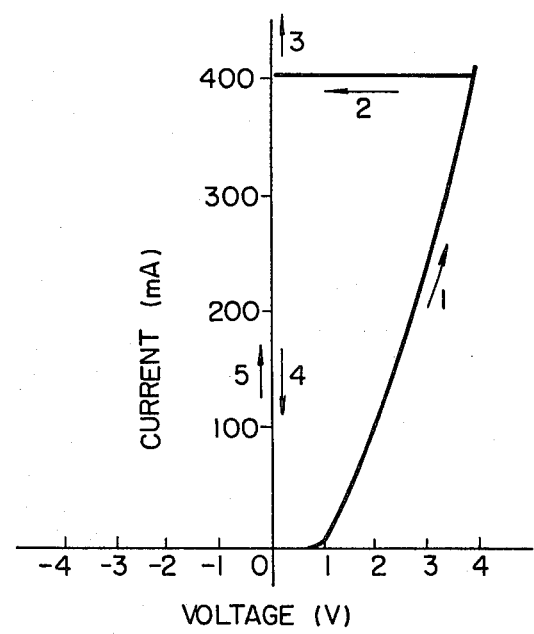
FIG. 7 is a diagram showing the current-vs-voltage characteristic of the conventional buried hetero structure type semiconductor laser device.

FIG. 7 shows the voltage-vs-current characteristic of the abovementioned semiconductor laser device when the impurity concentration is set below $2 \times 10^{17} cm^{-3}$ for its p-type InP layer 19 and below $1 \times 10^{17} cm^{-3}$ for its n-type InP layer 20. The negative resistance region of the current-vs-voltage characteristic as in the present invention can not be seen. When the current value is 400 mA, the semiconductor laser device is brought into the shunt state and is perfectly degraded. Arrows and numeral in FIG. 7 represent the sequence of characteristics.

It is extremely desirable that the conduction type of the semiconductor layer 14 above the active region 13 is opposite to the conduction type of the confining region 20 that comes into contact with it. This arrangement not only blocks the leaking current but also further improves the operation of the diode juxtaposed with the active region.

EXAMPLE 2

Figure 8:
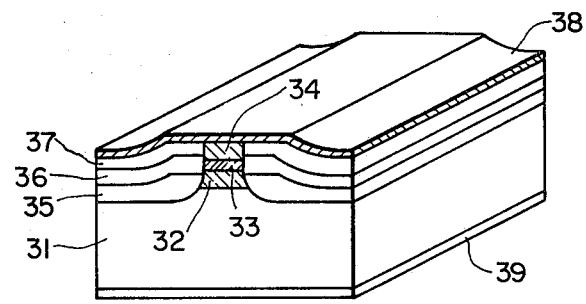

FIG. 8 is a perspective view showing another embodiment of the present invention.

Onto the (100) plane of an n-type GaAs substrate 31, the following semiconductor layers are formed by the epitaxial growth in each thickness stipulated;

n-type $Ga_{0.7}Al_{0.3}As$ 32 (Sn-doped, impurity concentration $2\times 10^{18}cm^{-3}$, 1 μm-thick), p-type GaAs 33 (un-doped, impurity concentration $5\times 10^{16}cm^{-3}$, 0.5 μm-thick), and p-type $Ga_{0.7}Al_{0.3}As$ 34 (Ge-doped, impurity concentration $2\times 10^{18}cm^{-3}$, 1 μm-thick).

The growth of each layer is made by the known liquid phase epitaxial process.

An 8 μm-wide $SiO_2$ film is formed in the <110> direction parallel to the cleavage direction of crystal. Using this as the mask, etching is made to leave a belt-like region parallel to the <110> direction till it reaches the substrate. After this etching is completed, the following semiconductor layers are again allowed to grow sequentially;

p-type $Ga_{0.6}Al_{0.4}As$ 35 (Ge-doped, impurity concentration $1\times 10^{18}cm^{-3}$), n-type $Ga_{0.6}Al_{0.4}As$ 36 (Sn-doped, impurity concentration $2\times 10^{18}cm^{-3}$), and p-type $Ga_{0.6}Al_{0.4}As$ 37 (Ge-doped, impurity concentration $2\times 10^{18}cm^{-3}$).

Since the growth occurs only in the region in which etching reaches the n-type GaAs substrate, there is obtained a laminate structure of semiconductors such as shown in FIG. 8.

Next, Cr and Au evaporation is made onto the growth layers while Au-Ge-Ni is evaporated onto the back of the substrate. Finally, the semiconductor assembly for forming an optical cavity is vertically cleft into the belt-like region, thereby completing the semiconductor laser device.

In this example, too, the current-vs-voltage characteristic shows the negative resistance characteristic and the degradation of the semiconductor laser device can be prevented.

Though the foregoing examples illustrate examples of the burried hetero structure type semiconductor laser device, the object of the present invention can be accomplished similarly by employing a construction in which at least one p-n junction is formed in parallel to the operating region of semiconductor laser devices in general and employing predetermined impurity concentration. Of course, two p-n junctions or more can be also formed in parallel to the operating region of semiconductor laser device.

What is claimed is:

1. In a semiconductor laser device including at least an active region comprised of a semiconductor material and a semiconductor region comprised of a material having a different composition from that of said active region and confining said active region, said semiconductor laser device characterized in that at least one p-n junction is formed inside said confining region in parallel to said active region, wherein the impurity concentration of said region having said p-n junction is set to permit at least a portion of a current flowing to said active region to flow through regions other than said active region via said p-n junction when said current reaches a predetermined level which is less than a level at which said current flow causes degradation of said semiconductor laser device.

2. In a semiconductor laser device as defined in claim 1 wherein the impurity concentration of said region having said p-n junction is at least $5\times 10^{17}cm^{-3}$.

3. In a semiconductor laser device as defined in claim 1 or 2 wherein plural semiconductor layers including said active region are disposed in a belt-like mesa structure on a predetermined semiconductor substrate; said active region is interposed by semiconductor layers of low refractive index inside said mesa structure; the side surfaces of said mesa structure placed in parallel to the travelling direction of the laser light are buried in said semiconductor layers of low refractive index; and said p-n junction is formed inside said semiconductor layers of low refractive index having said mesa structure burried therein.

4. In a semiconductor laser device as defined in claim 1 or 2 wherein the conduction type of the semiconductor layer on said active region is opposite to the conduction type of the semiconductor layer of said confining region coming into contact therewith.

5. In a semiconductor laser device as defined in claim 1 wherein a reverse breakdown voltage of said p-n junction is set by controlling the impurity concentration of said region having said p-n junction to a breakdown level which permits the p-n junction to by-pass current from said active region to said regions other than said active region at a current level which is less than a current level which will cause degradation of said semiconductor laser device.

* * * * *